United States Patent [19]

Terada et al.

[11] Patent Number: 4,803,526

[45] Date of Patent: Feb. 7, 1989

[54] SCHOTTKY GATE FIELD EFFECT TRANSISTOR AND MANUFACTURING METHOD

[75] Inventors: Toshiyuki Terada, Kawasaki; Mayumi Hirose; Kenji Ishida, both of Yokohama, all of Japan

[73] Assignee: Kabushiki Kaisha Toshiba, Kawasaki, Japan

[21] Appl. No.: 19,682

[22] Filed: Feb. 17, 1987

Related U.S. Application Data

[63] Continuation of Ser. No. 781,930, Sep. 30, 1985, abandoned.

[30] Foreign Application Priority Data

Nov. 2, 1984 [JP] Japan ................... 59-231711
Mar. 28, 1985 [JP] Japan ................... 60-64423

[51] Int. Cl.[4] .................................. H01L 29/48
[52] U.S. Cl. ........................... 357/15; 357/22; 357/89; 357/90
[58] Field of Search ................ 357/15, 22, 89, 90

[56] References Cited

U.S. PATENT DOCUMENTS

4,064,525 12/1977 Kano et al. ................... 357/22
4,216,038 8/1980 Nishizawa et al. ............ 357/22
4,393,578 7/1983 Cady et al. ................... 357/22 J

FOREIGN PATENT DOCUMENTS

0175864 7/1981 European Pat. Off. .
0076676 7/1978 Japan ............................ 357/22

OTHER PUBLICATIONS

Patent Abstracts of Japan–vol. 8, No. 277 (E-285) [1714]-12-18[-84 & JP-A-59 147464 (ASAI).
Patents Abstracts of Japan, vol. 8, No. 277 (E-285) [1714], 18th Dec. 1984; & JP-A-59 147 464 (Nippon Denki K.K.)
IBM Technical Disclosure Bulletin, vol. 25, No. 5, Oct. 1982, p. 2373, New York, US; T. L. Andrade: "MESFET Device with Reduced Source and Drain Capacitance".
International Electron Devices Meeting, San Francisco, CA, US, 13th-15th Dec. 1982, pp. 718-721, IEEE, New York, US; S. Ogura et al: "A Half Micron MOSFET Using Double Implanted LDD".
Patents Abstracts of Japan, vol. 5, No. 171 (E-80) [843], 30th Oct. 1981; & JP-A-56 100 478 (Tokyo Shibaura Denki K.K.) 12-08-1981.
IBM Technical Disclosure Bulletin, vol. 26, No. 4, Sep. 1983, pp. 1988-1989, New York, US; C. F. Codella et al. "GaAs LDD E-MESFET for Ultra-High Speed Logic", FIG. 2.
The Institute of Applied Physics: A Draft Paper for '83 Spring National Meeting Lecture 7p-D-3, P457: Experimental Study Electrical Properties of Submicron Length Gate Self-Alignment Structured GaAs Fet.
The Institute of Electronics and Communication Engineers of Japan ED 84-86, pp. 1-6, "10ps Buried P-Layer Saint for GaAs LSIs".

*Primary Examiner*—Edward J. Wojciechowicz
*Attorney, Agent, or Firm*—Oblon, Fisher, Spivak, McClelland & Maier

[57] ABSTRACT

In a GaAs field effect transistor of the invention, a gate layer is formed on a semi-insulative substrate. The gate layer is made of a conductive material forming a Schottky junction between the substrate and the gate layer. Source and drain regions are formed in the substrate to have a first conductivity type. Barrier layers are formed in the substrate to have a second conductivity type. The barrier layers are formed to surround the source and drain regions, and suppress a current component from leaking from the source and drain regions to the substrate when the field effect transistor is operative.

6 Claims, 6 Drawing Sheets

SCHOTTKY GATE FIELD EFFECT TRANSISTOR AND MANUFACTURING METHOD

This application is a continuation of application Ser. No. 781,930, filed on Sept. 30, 1985, now abandoned.

BACKGROUND OF THE INVENTION

The present invention relates to a field effect transistor using a semi-insulative compound substrate and a manufacturing method thereof.

In general, a Schottky gate field effect transistor (to be referred to as a "MESFET" hereinafter) comprises a semi-insulative compound substrate, e.g., a gallium-arsenide (GaAs) substrate. An active layer of a predetermined conductivity type (e.g., an n type) is formed in a surface portion of the GaAs substrate. A gate electrode is formed on the GaAs substrate so as to form a Schottky gate barrier together with the active layer. High concentration active regions of a predetermined conductivity type (e.g., an n+type) serving as source and drain electrodes are formed in the substrate so as to be self-aligned with the gate electrode. When such self-aligned source and drain electrodes are formed, the substrate is subjected to ion-implantation using the gate electrode as a mask.

In order to respond to demand for highly integrated IC chips, when a higher packing density of MESFETs on substrates is to be achieved, the MESFETs must be micropatterned. In accordance with the micropatterning of MESFETs, the gate width and the distance between the source and drain regions is decreased. As a result, since an electric field applied to an active layer serving as a channel region is increased, a current flowing in the semi-insulative substrate under the active layer is increased. Such an increase in current; decreases the threshold value of the MESFET, undesirably increases the drain conductance, and decreases the mutual conductance. Such drawbacks notably occur in a MESFET using a semi-insulative substrate described above since the MESFET originally has a low potential barrier between the source and drain regions unlike a normal MOSFET using a conductive substrate. Therefore, it is difficult to form MESFETs with excellent electrical characteristics by micropatterning using a conventional technique.

SUMMARY OF THE INVENTION

It is therefore an object of the present invention to provide a new and improved field effect transistor which is micropatterned on a semi-insulative compound substrate and has excellent electrical characteristics.

It is another object of the present invention to provide a new and improved method for forming a field effect transistor with excellent electrical characteristics on a semi-insulative compound substrate by micropatterning.

According to a field effect transistor of the present invention, a gate layer is formed on a semi-insulative substrate. The gate layer is made of a conductive material forming a Schottky junction between itself and the substrate. Source and drain regions are formed in the substrate so as to have a first conductivity type. A barrier layer having a second conductivity type is formed in the substrate so as to be in contact with at least one of the source and drain regions. The barrier layer suppresses leakage of a current component from at least one of the source and drain regions to the substrate when the field effect transistor is operated.

According to a method of manufacturing a field effect transistor of the present invention, a gate layer is formed on a semi-insulative substrate on which an active layer is formed. Insulative layers are formed on the substrate by isotropic deposition and anisotropic etching so as to be in contact with two sides of the gate electrode. Subsequently, impurities of first and second conductivity types are sequentially ion-implanted in the substrate using the gate layer and insulative layers as a mask, thereby forming: source and drain regions of one conductivity type; and at least one barrier layer of the other conductivity type for suppressing leakage of a current component from at least one of the source and drain regions to the substrate when the field effect transistor is operated.

BRIEF DESCRIPTION OF THE DRAWINGS

The present invention is best understood by reference to the accompanying drawings, in which.

Detailed Description of the Preferred Embodiments

Figure 1:
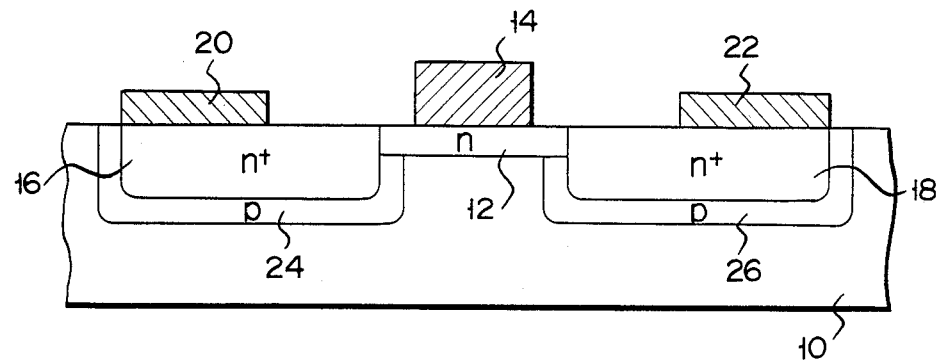
FIG. 1 is a sectional view of a GaAs MESFET according to a first embodiment of the present invention.

A Schottky gate field effect transistor (to be referred to as a "MESFET" hereinafter) according to one preferred embodiment of the present invention will be described with reference to FIG. 1. Referring to FIG. 1, a semi-insulative substrate 10 is made of gallium-arsenide (GaAs) having a resistivity of $10^7$ to $10^8$ ohm-cm. An active layer 12 of a predetermined conductivity, e.g., an n type, is formed in a surface portion of the substrate 10. A gate layer 14 is formed on the surface portion of the substrate 10 in which the active layer 12 is formed. In this embodiment, the gate layer 14 forms a Schottky junction with the substrate 10, and is formed of a tungsten nitride (WNx) with a thin film 400 nm thick.

High concentration regions 16 and 18 of the same conductivity as that of the active layer 12 are formed in the substrate 10 at two sides of the gate layer 14. The n+regions 16 and 18 are deeper than the active layer 12, and serve as source and drain regions of the GaAs MESFET. The MESFET is micropatterned so that the width of the gate layer is smaller than the distance between the source and drain regions 16 and 18. Metal layers 20 and 22 which serve as source and drain electrodes are formed on the source and drain regions 16 and 18.

In the micropatterned GaAs MESFET with the above structure, barrier layers 24 and 26 are formed in the substrate 10 so as to surround the source and drain regions 16 and 18, respectively. However, no barrier layer is formed at the junction between the active layer 12 and the substrate 10. The barrier layers 24 and 26 have a conductivity (i.e., p type) opposite to that of the regions 16 and 18. The barrier layers 24 and 26 form potential barriers between the substrate 10 and the regions 16 and 18, respectively. Therefore, the layers 24 and 26 can effectively suppress the injection of charge carriers (electrons in this embodiment) from the regions 16 to 18 to the substrate 10 when the MESFET is operated.

Figure 2A:
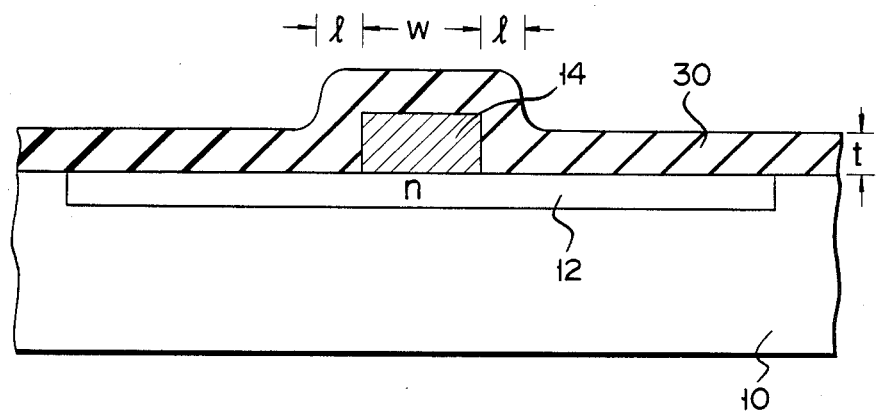
FIGS. 2A to 2E are sectional views respectively showing main steps in a manufacturing method of the GaAs MESFET shown in FIG. 1.

A manufacturing method of the GaAs MESFET having the carrier injection preventive layers 24 and 26 will be described with reference to FIGS. 2A to 2E. Referring to FIG. 2A, Si+ions are implanted in the surface portion of the semi-insulative GaAs substrate 10 by selective-ion implantation, thereby forming the n type impurity region 12 serving as an active layer. The selective-ion implantation of the Si+ions is performed, e.g., at an acceleration voltage of 50 keV and a dose of $2.0 \times 10^{12}/cm^2$. Then the WN$_x$ film is formed on the substrate 10 by a well known photolithography technique and by dry etching so as to have a width of 1.0 $\mu$m (indicated by "w" in FIG. 2A) and a thickness of 400 nm.

Figure 2B:
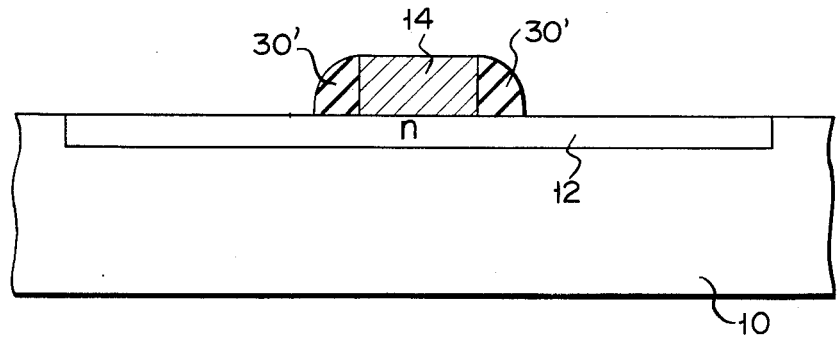

Subsequently, a silicon oxide (siO$_2$) film 30 is deposited on the overall surface of the substrate 10 with the gate layer 14 to a 300 nm thickness t. As a result, since the SiO$_2$ film 30 is isotropically grown on the substrate 10 with the gate layer 14, the lateral length l of portions of the film 30 adjacent to the side walls of the gate layer 14 becomes substantially equal to the thickness t of the film 30, as illustrated in FIG. 2A. The isotropically deposited film 30 is anisotropically etched along the direction of the thickness by the dry etching such as RIE (reactive ion etching). In accordance with the RIE, the film 30 is uniformly etched along the vertical direction by its thickness t. In this case, since the film 30 is etched along the direction of the thickness with strong anisotrophy, substantially no etching occurs along the lateral direction. As a result, as shown in FIG. 2B, two isulative components 30' are left on the substrate 10 so as to be adjacent to two sides of the gate layer 14.

Figure 2C:
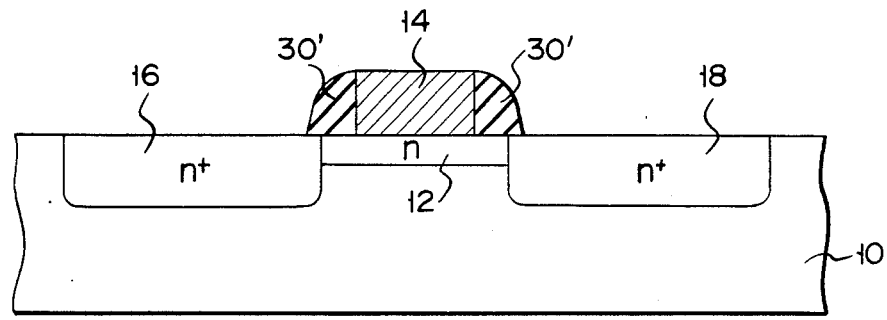

An n type impurity (e.g., silicon ions) is ion-implanted in the substrate utilizing the gate layer 14 and the components 30' as a mask structure, e.g., at an acceleration voltage of 100 keV and a dose of $1.0 \times 10^{14}/cm^2$. As a result, the source and drain regions 16 and 18 of n+conductivity type are formed to be substantially self-aligned with the gate structure consisting of the gate layer 14 and the components 30', as shown in FIG. 2C.

Subsequently, a p type impurity (e.g., magnesium ions) is ion-implanted in the substrate 10 using the mask structure, e.g., at an acceleration voltage of 240 keV and a dose of $5 \times 10^{14}/cm^2$. Under such conditions, the average range of magnesium (Mg) ions is longer than that of the silicon ions for forming the regions 16 and 18, and a diffusion distance of Mg ions along the lateral direction (of the substrate 10) due to the scattering of ion-implantation is also longer than that of Si ions.

Therefore, Mg ions are implanted in regions larger in size than the regions 16 and 18. Thus, the p type barrier layers 24 and 26 contacting the lower portions and side portions of the regions 16 and 18 can be obtained. It should be noted that in the ion-implantation step of forming the layers 24 and 26, although the Mg ions are also ion-implanted in the regions 16 and 18, a decrease in the concentration of the regions 16 and 18 can be ignored. This is because the ion-implantation amount of Mg ions is smaller than that of silicon ions for forming the regions 16 and 18. Furthermore, although Mg ions are also mixed in the active layer 12 below the components 30' due to diffusion of ions along the lateral direction, the n type active layer 12 can no longer be inverted into a p conductivity type for the same reason as described above.

Figure 2D:
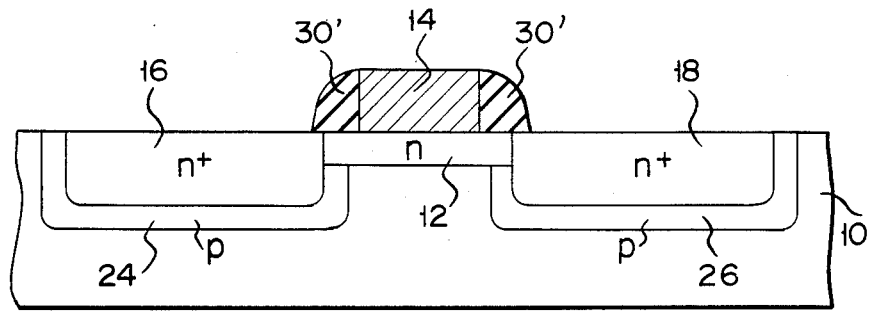
Figure 2E:
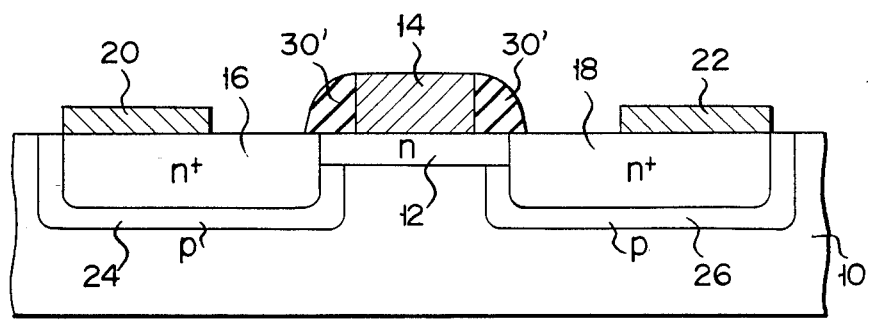

The layer structure shown in FIG. 2D is annealed at a temperature of 800 to 850° C. so as to activate the impurity implanted in the substrate 10. Source and drain electrodes made of, e.g., an AuGe alloy are formed on the regions 16 and 18, respectively, as shown in FIG. 2E, thus forming the GaAs MESFET of the present invention.

When the MESFET of the present invention was compared with a conventional MESFET formed under the same conditions as the present invention, the conventional MESFET had a threshold value of $-0.1$ V, and the MESFET of the present invention had a threshold value of $+0.05$V. For the purpose of comparison, when MESFETs having a gate length of 10 $\mu$m were formed according to the conventional method and the method of the present invention, both the MESFETs had a threshold value of $+0.1$ V. As can be seen from these data, in the conventional MESFET, the threshold voltage negatively shifts by 0.2V due to a current flowing through the substrate with a reduced channel width, but in the MESFET of the present invention, the shift amount can be reduced to 0.05V.

In a field effect semiconductor apparatus of the present invention, even when micropatterned, a leakage current flowing from the source and drain regions to the substrate 10 and flowing through the substrate under the active layer as a channel region can be controlled or inhibited. As a result, a decrease in the threshold voltage, an increase in the drain conductance and a decrease in mutual conductance due to a shorter channel width can be suppressed, thus obtaining a high performance field effect semiconductor apparatus.

According to a method of the present invention, the excellent element characteristics as described above can be realized simply by adding the ion-implantation step of forming the barrier layer to conventional steps. In addition, the ion-implantation step of forming the barrier layer can be easily performed using the gate electrode and the insulative films formed on the side walls thereof at a proper timing after (or before) the ion-implantation step of forming the source and drain regions.

Therefore, if the GaAs MESFET and the manufacturing method thereof of the present invention are applied to a highly integrated IC chip, MESFETs can be micropatterned and a highly integrated IC chip with an improved basic operation performance such as operation speed of MESFETs can be realized.

Figure 3:
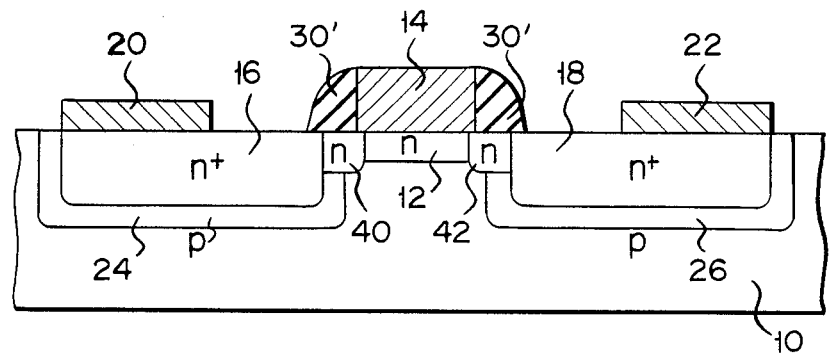
FIG. 3 is a sectional view of a GaAs MESFET according to a second embodiment of the present invention.

A GaAs MESFET according to a second embodiment of the present invention will be described with reference to FIGS. 3. The same reference numerals in FIG. 3 denote the same parts as in FIG. 1, and a detailed description thereof will be omitted. Referring to FIG. 3, n type layers 40 and 42 are added to junctions between source and drain regions 16 and 18 and an active layer 12. Therefore, the source region 16 is electrically connected to the active layer 12 through the layer 40, and the drain region 18 is electrically connected to the layer 12 through the other layer 42. Since the sub-active layers 40 and 42 are added, a decrease in concentration of the active layer 12 due to ion implantation of an impurity (Mg) for forming barrier layers 24 and 26 can be prevented.

The sub-active layers 40 and 42 can be formed by ion-implanting silicon ions, e.g., at an acceleration voltage of 50 keV and a dose of $5 \times 10^{12}/cm^2$ before forming an insulative layer 30 on a substrate 10 and a gate layer 14 formed thereon. Thus, sub-active layers 40 and 42 having substantially the same depth as that of the active layer 12 and an impurity concentration substantially 1.2 to 5 times that of the active layer 12 could actually be formed.

Figure 4A:
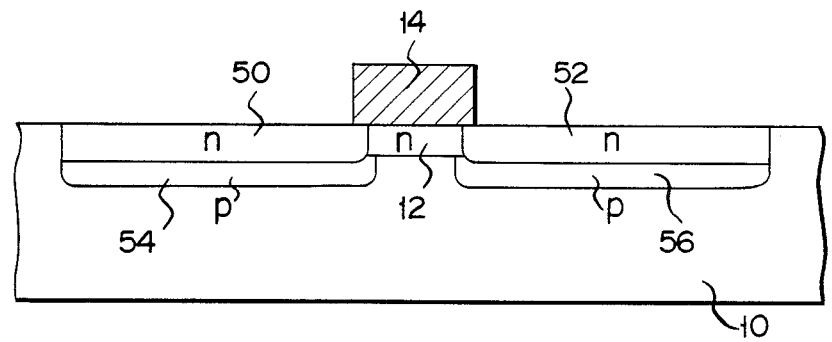
FIGS. 4A and 4B are sectional views respectively showing the main steps in a manufacturing method of a GaAs MESFET according to a third embodiment of the present invention.
Figure 4B:
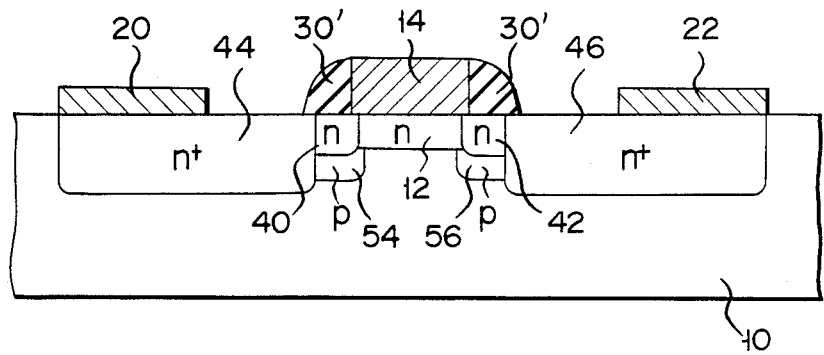

A GaAs MESFET according to a third embodiment of the present invention will be described with reference to FIGS. 4A and 4B. The same reference numerals in FIGS. 4A and 4B denote the same parts as in FIGS. 1 and 3, and a detailed description thereof will be omitted. Referring to FIG. 4A, in the same manner as in FIG. 2A, after an active layer 12 is formed, a gate layer 14 is formed on a surface portion of a semi-insulative GaAs substrate 10. Si and Mg ions are sequentially ion-implanted in the substrate 10 using the gate layer 14 as a mask, thus forming n type layers 50 and 52 having an impurity concentration slightly higher than that of the active layer 12, and forming p type barrier layers 54 and 56. The layers 54 and 56 are substantially self-aligned with the gate layer 14 (see FIG. 4A). In this case, the Si ions are ion-implanted to have substantially the same maximum implantation depth in the substrate 10 as that in the active layer 12. The Mg ions are ion-implanted to have a maximum implantation depth larger than that in the active layer 12 and equal to or slightly smaller than that in source and drain regions to be formed later.

Thereafter, in the same manner as in the above embodiments, insulative layer components 30' are formed at two sides of the layer 14. Si ions are ion-implanted in the substrate 10 using the layer 14 and the components 30' as a mask to obtain a high concentration. Thus, $n^+$ type source and drain regions are formed (see FIG. 4B). According to the GaAs MESFET of this embodiment, the barrier layers 54 and 56 are provided in side portions of regions 44 and 46 facing the layer 12. No barrier layers are formed in other portions (e.g., bottom portions and other side portions) of the regions 44 and 46. This is because a leakage current from the regions 44 and 46 to the substrate 10 most frequently occurs from portions of the regions 44 and 46 facing the layer 12. Therefore, according to the GaAs MESFET of the third embodiment of the present invention, a barrier layer for effectively preventing leakage current can be small in size.

Figure 5:
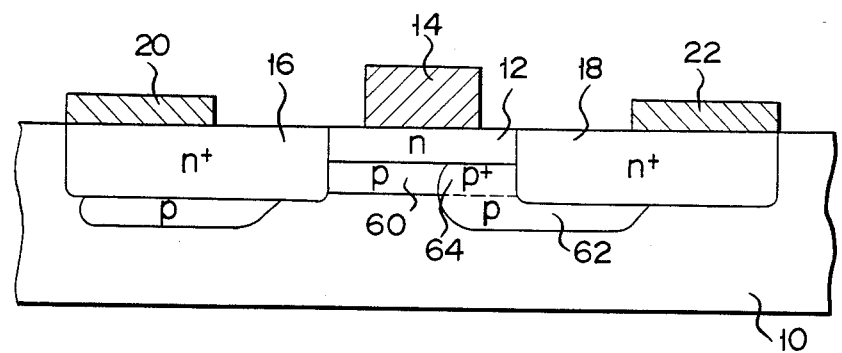
FIG. 5 is a sectional view of a GaAs MESFET according to a fourth embodiment of the present invention.

A GaAs MESFET according to a fourth embodiment of the present invention will be described with reference to FIG. 5. The same reference numerals in FIG. 5 denote the same parts as in the above embodiments, and a detailed description thereof will be omitted. Referring to FIG. 5, a gate layer 14 is formed on an n type active layer formed in a GaAs substrate 10. $N^+$ type regions 16 and 18 are formed to be deeper than the active layer 12 and serve as source and drain regions of the GaAs MESFET. Metal layers 20 and 22 which serve as source and drain electrodes are formed on the source and drain regions 16 and 18, respectively.

In the micropatterned GaAs MESFET with the above structure, an impurity layer 60 having a conductivity type (i.e., a p type) opposite to that of the regions 16 and 18 is formed in a channel region of the substrate 10 so as to be in contact with the lower surface of the active layer 12. The p type layer 60 is also in contact with the source and drain regions 16 and 18, as shown in FIG. 5. Another p type layer 62 is provided to surround an edge portion of the region 18 at the side of the channel region so as to partially overlap the layer 60. Therefore, an overlapping portion 64 of the layers 60 and 62 has a concentration ($p^+$ type) higher than that of other p type layers. In other words, the high concentration p type layer 64 is formed in a substrate region corresponding to a junction portion between the p type layer 60 and the drain region 18. The p type layers 60 and 62 (particularly, the $p^+$ type layer 64) form potential barriers between the substrate 10, and the drain region and the active layers, respectively.

Since the p type layer 60 is formed to be connected to the entire lower surface of the layer 12, a depletion layer (barrier) is formed on the entire lower surface of the layer 12. Therefore, charge carriers can be prevented from leaking from the layer 12 to the region of the substrate 10 immediately thereunder. A leakage current in the channel region of the MESFET can be prevented, and element characteristics (e.g., operation speed) of the micropatterned GaAs MESFET can be effectively improved. Since the layer 60 is formed to be connected to the entire lower surface of the layer 12, an internal electric field of the layer 12 reduced in size by micropatterning of the MESFET can be prevented from being undesirably modulated due to a drain voltage (in general, when a gate length is reduced, the ratio of the length to depth of the layer 12 becomes small, and an adverse influence of the drain voltage cannot be ignored). This is because the p type layer 60, formed on the entire lower surface of the active layer 12, serves to absorb ions deeply implanted in the substrate 10, whereby the bottom portion of the active layer 12 is depleted to substantially decrease the effective depth of the active layer 12. As a result, the ratio of the length to the depth of the layer 12 is increased (i.e., the active layer 12 is rendered shallower), and an adverse influence from the drain voltage can be prevented.

Furthermore, a high concentration p type region 64 is formed as a barrier layer in the drain region 18. Since the region 64 serves to form a stronger barrier, a leakage current from the drain region 18 can be further suppressed, and the effective depth of the layer 12 can be further decreased. Since the region 64 is formed in the edge portion of the drain region 18 at the side of the channel region, the decrease in channel conductance of the MESFET can be controlled to be a minimum. In other words, when the MESFET of the present invention is assumed to have the same threshold voltage as that of the conventional MESFET, the channel conductance of the MESFET of the present invention can be increased as compared to that of the conventional MESFET. Therefore, although micropatterned, a MESFET having high current drive performance can be prepared.

A manufacturing method of the GaAs MESFET with the above structure will be described with reference to FIGS. 6A to 6D. Si ions are ion-implanted in the surface portion of the GaAs substrate 10 using a predetermined mask (not shown), thereby forming the n type impurity region 12 serving as the active layer. Si ions are ion-implanted, e.g., at an acceleration voltage of 50 keV and a dose of $3.0 \times 10^{12}/cm^2$. Subsequently, using the same mask as described above, Beryllium (Be) ions are ion-implanted in the substrate 10 at an acceleration voltage of 70 keV and a dose of $3.0 \times 10^{11}/cm^2$, thereby obtaining the p type layer 60 deeper than the active layer 12. A WNx film is formed on the substrate 10 by a well known photolithography technique and dry etching so as to have a width of 1.0 μm and a thickness of 400 nm (see FIG. 6A).

Figure 6A:
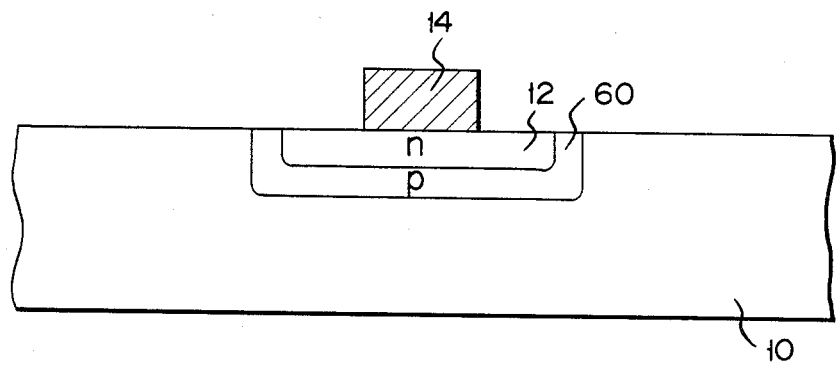
FIGS. 6A to 6D are sectional views showing the main steps in a manufacturing method of the GaAs MESFET shown in FIG. 5.
Figure 6B:
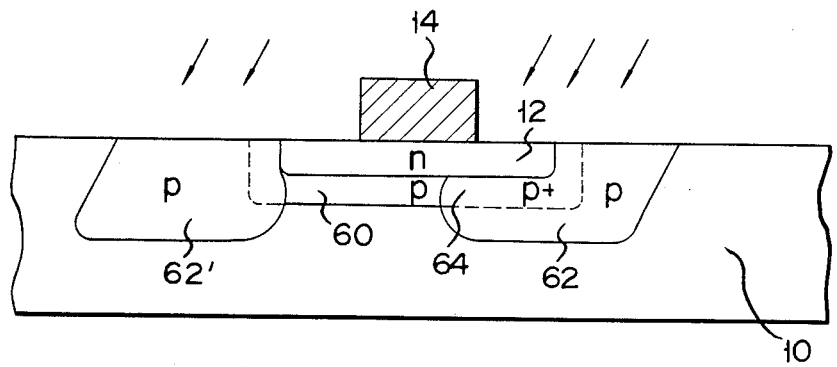

Subsequently, the resultant wafer is subjected to ion-implantation while being inclined substantially at a desired angle, e.g., 45° with respect to an irradiation direction of ion beams. As shown in FIG. 6B, the substrate 10 was irradiated wiht Be ion beams from the drain side of the gate layer 14 at an inclination of substantially 45° using the gate layer 14 as a mask at, e.g., an acceleration voltage of 90 keV and a dose of $3.0 \times 10^{12}/cm^2$. As a result, a p type layer 62 extending in the lateral direction of the structure at the drain side of the active layer 12 can be formed. At this time, another p type layer indicated by reference numeral 62' in FIG. 6B is formed in a portion corresponding to the source region of the substrate 10. However, the layer 62' does not influence the element characteristics of the MESFET at all.

Figure 6C:
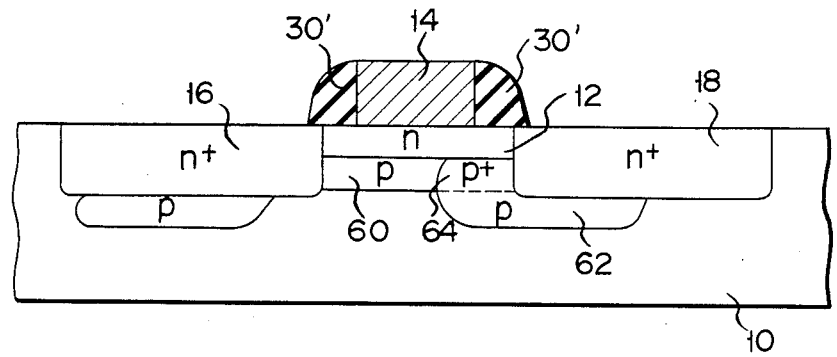

Thereafter, as shown in FIG. 6C, two insulative layer components 30' are formed adjacent to two sides of the gate layer 14 on the substrate 10 by using plasma CVD and anisotropic etching such as RIE. Then, an n type impurity (e.g., Si ions) is ion-implanted in the substrate 10 using the gate layer 14 and the components 30' as a mask structure at, e.g., an acceleration voltage of 100 keV and a dose of $1.0 \times 10^{14}/cm^2$. The n+type source and drain regions 16 and 18 are formed deeper than the active layer 12 to be substantially self-aligned with the gate structure, consisting of the layer 14 and the components 30', as shown in FIG. 6C.

Figure 6D:
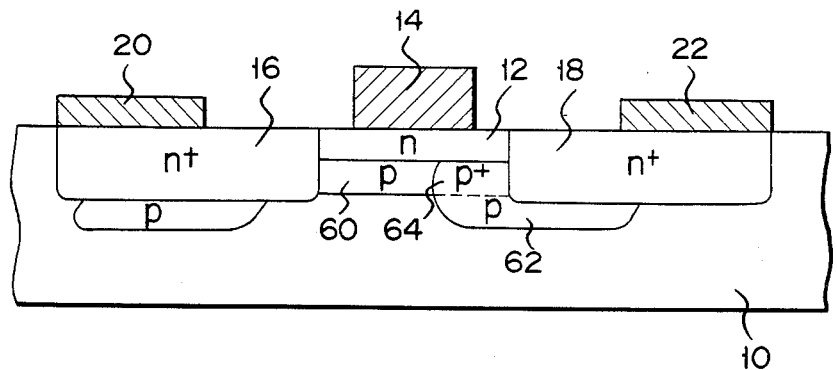

The resultant structure shown in FIG. 6C is annealed at a temperature of 800° to 850° C. so as to activate the impurities ion-implanted in the substrate 10. The source and drain electrodes 20 and 22 made of, e.g., An AuGe alloy are formed on the source and drain regions 16 and 18, respectively, as shown in FIG. 6D, thus completing the GaAs MESFET of the present invention.

In general, when a dose in the ion-implantation step of forming the active layer 12 is set to be relatively large, e.g., $3.0 \times 10^{12}/cm^2$, the conventional MESFET becomes a normally-on type. However, the MESFET manufactured in accordance with the method of the present invention was of a normally-off type. This is because the p+type layer 64 formed in the edge portion of the active layer 12 at the side of the drain produces a junction potential between itself and the active layer 12, and a lower portion of the active layer 12 is depleted so as to decrease a depth of the layer 12.

Furthermore, according to the MESFET manufactured in accordance with the present invention, since a depletion layer is formed in the internal bottom region of the active layer 12 due to a junction between the layers 12 and 60, a variation in distribution of the implanted ions in the substrate 10 for forming the active layer can be eliminated, thereby eliminating a variation in threshold voltage of the MESFET to half that of the conventional MESFET.

According to the manufacturing method of the MESFET described with reference to FIGS. 6A to 6D, the p type layer 62 connected to the internal edge portion of the drain region 18 and having a special shape extending below the gate layer 14 can be formed with good controllability and reproducibility by adopting the inclined ion-implantation method.

Figure 7:
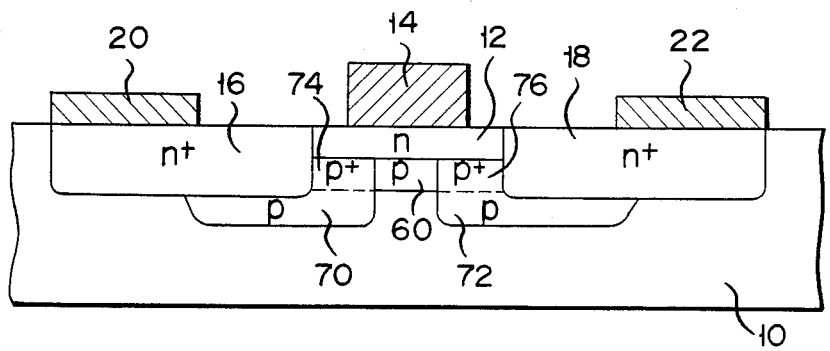
FIG. 7 is a sectional view of a GaAs MESFET according to a fifth embodiment of the present invention.

A GaAs MESFET according to a fifth embodiment of the present invention will be described with reference to FIG. 7. Referring to FIG. 7, two projective p type layers 70 and 72 are symmetrically provided with respect to source and drain regions 16 and 18, respectively. Two p+type layers 74 and 76 are formed between a p type layer 60 contacting the bottom surface of an active layer 12, and the layers 70 and 72, respectively. The layers 74 and 76 are located at two ends of the layer 60 so as to correspond to junction regions between the active layer 12, and the source and drain regions 16 and 18, respectively. With this structure, the same effect as in the present invention can be obtained. Furthermore, since the sectional structure of the MESFET is symmetrical with respect to the regions 16 and 18, either the region 16 or 18 can be used as a drain (or source) region. Therefore, when the MESFETs are integrated on a chip, an element layout can be simplified. As in the MESFET shown in FIG. 5, when the source and drains are structurally predetermined and a circuit configuration to be formed on the chip is complex, the "direction" of the MESFET on the chip must be determined, resulting in cumbersome circuit pattern design. In contrast to this, the MESFET shown in FIG. 7 can be suitably applied to an IC chip having a complex layout, thus simplifying circuit pattern design.

Figure 8A:
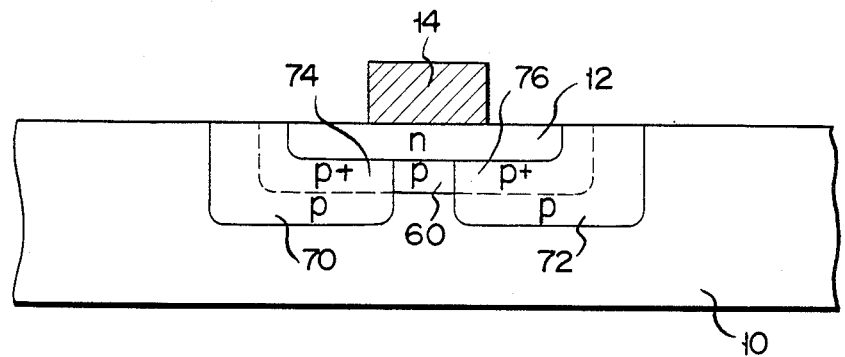
FIGS. 8A to 8C are sectional views showing the main steps in a manufacturing method of the GaAs MESFET shown in FIG. 7.

The manufacturing method of the GaAs MESFET with the above-mentioned structure will be described with reference to FIGS. 8A to 8C. Beryllium (Be) ions are ion-implanted in the resultant wafer obtained in the manufacturing step of FIG. 6A. In this case, the Be ions are vertically ion-implanted in the substrate 10 using the gate layer 14 as a mask at, e.g., an acceleration voltage of 90 keV and a dose of $5.0 \times 10^{11}/cm^2$. As a result, the p type layers 70 and 72 are formed deeper than the p type layer 60 contacting the bottom surface of the active layer 12, as shown in FIG. 8A. The layers 70 and 72 laterally extend under the active layer 12 because of scattering of the impurity in the case of Be ion-implantation and thermal annealing for activating the impurity, as shown in FIG. 8A. Therefore, the layers 70 and 72 overlap the layer 60, thereby forming the p+type regions 74 and 76.

Figure 8B:
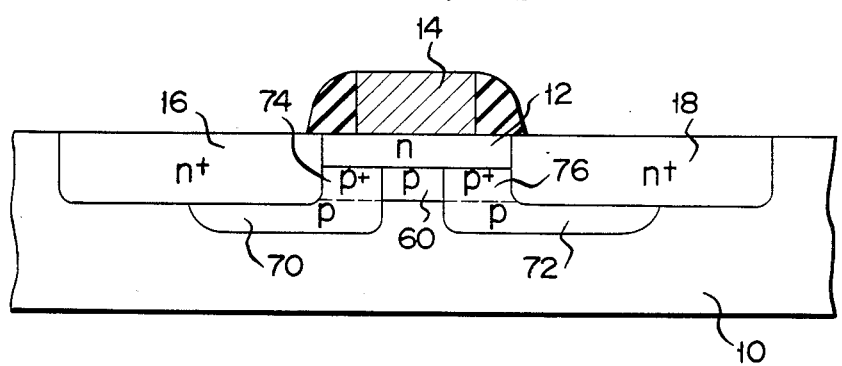
Figure 8C:
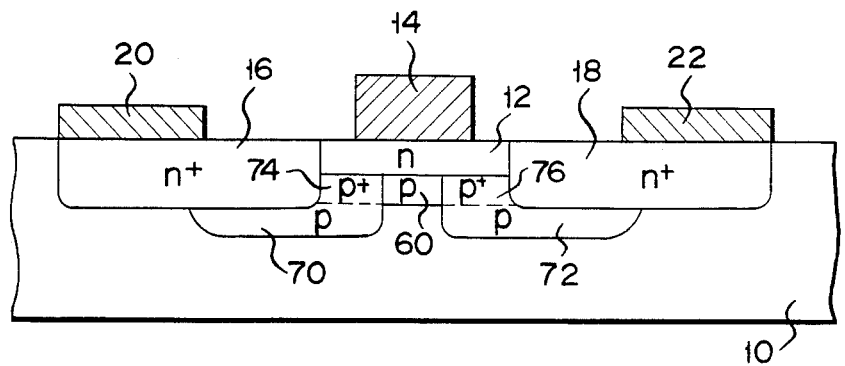

Thereafter, in accordance with the above-mentioned method, insulative layers 30' are formed at two sides of the gate layer 14, and the n+layers 16 and 18 each of which can be used either as source or drain regions are formed in the substrate 10 (see FIG. 8B). Subsequently, electrode metal layers 20 and 22 are deposited on the n+regions 16 and 18, thus completing the MESFET (see FIG. 8C).

According to the manufacturing method of this embodiment, a projective shape of the layers 70 and 72 can be desirably set by positively utilizing a natural phenomenon such as scattering of the impurity in the substrate 10 in the ion-implantation step and thermal annealing for activating the impurity. Therefore, the p type barrier layers 70 and 72 can be easily formed.

Although the present invention has been shown and described with reference to particular embodiments, various changes and modifications which are obvious to a person skilled in the art to which the invention pertains are deemed to lie within the scope of the invention.

In the manufacturing method of the GaAs MESFET described with reference to FIGS. 2A to 2E, the impurity (Mg ions) for forming the barrier layers 24 and 26 is ion-implanted after the ion-implantation of the impurity (Si ions) for forming the source and drain regions 16 and 18. However, these ion-implantation steps are not limited to the above-mentioned order, but can be reversed (i.e., the Mg ion-implantation step of forming the layers 24 and 26 can be performed prior to the Si ion-implantation step of forming the regions 16 and 18). In this case, the unique effect of the present invention can also be obtained.

Furthermore, parameter setting conditions of CVD and RIE, annealing conditions and the like used in the above embodiments are not limited to those described above, but can be changed in accordance with different situations. According to the present invention, materials and elements used in the above embodiment can be changed. For example, as a gate electrode, a material which can form a good Schottky barrier with n type GaAs, and can maintain the characteristics thereof after thermal treatment, can be used. That is, in addition to WNx, W, WSix, W-Al, Mo, MoSix or the like can be used. As ion-implanted impurities, Se, S or the like can be used in the case of an n channel MESFET. In the above embodiments, only an n channel MESFET has been described. However, the present invention can be applied to a p channel MESFET. Furthermore, the present invention can be applied to junction type FETs in addition to MESFETs, and can be applied when a semiinsulative compound semiconductor substrate is used.

What is claimed is:

1. A field effect transistor comprising:
a semi-insulative substrate;
a gate layer formed on said substrate and made of a conductive material forming a Schottky junction between said substrate and said gate layer;
source and drain regions formed in said substrate to have a first conductivity type;
a semiconductor active layer formed in a surface portion of said substrate in a manner so as to be in contact with said source and drain regions at first and second end portions, respectively, thereof to serve as a channel of said transistor; and
barrier layer means formed in said substrate to have a second conductivity type and to be in contact with an entire bottom portion of said active layer and at least said drain region, for forming therein an impurity concentration gradient under said active layer and said drain layer such that the impurity concentration of said barrier layer means under the second end portion of said active layer is higher than that under a middle portion of said active layer and that under said drain region, for suppressing current leakage from at least said drain region to said substrate, and for suppressing a depletion layer from over-expanding in a middle portion of said active layer due to a junction between said channel and said barrier layer means, to thereby improve a current drivability of said transistor.

2. The transistor according to claim 1, wherein said barrier layer means comprises:
a first semiconductor barrier layer which is positioned under said bottom portion of said active layer and in contact with the entire bottom portion of said active layer; and
a second semiconductor barrier layer which is at least partially in contact with said drain region and overlaps said first barrier layer in such a manner as to define a heavily-doped region positioned just under the second end portion of said active layer.

3. The transistor according to claim 2, wherein said barrier layer means further comprises:
a third semiconductor barrier layer which is at least partially in contact with said source region and overlaps said first barrier layer in such a manner as to define a heavily-doped region positioned just under the first end portion of said active layer.

4. A field effect transistor comprising:
a semi-insulative substrate;
a gate layer formed on said substrate and made of a conductive material forming a Schottky junction between said substrate and said gate layer;
source and drain regions formed in said substrate to have a first conductivity type;
a semiconductor active layer formed in a surface portion of said substrate in a manner as to be in contact with said source and drain regions at first and second end portions, respectively, thereof to serve as a channel of said transistor; and
barrier layer means, formed in said substrate to have a second conductivity type, for suppressing current leakage from at least said drain region to said substrate, said barrier layer means comprising,
a first semiconductor barrier layer which is positioned under said active layer and in contact with the entire bottom portion of said active layer, and
a second semiconductor barrier layer which is at least partially in contact with said source region and overlaps said first barrier layer in such a manner as to define a heavily-doped region positioned just under the first end portion of said active layer.

5. The transistor according to claim 4, wherein said barrier layer means further comprises:
a third semiconductor barrier layer which is at least partially in contact with said drain region and overlaps said first barrier layer in such a manner as to define a heavily-doped region positioned just under the second end portion of said active layer.

6. The transistor according to claim 5, wherein said second and third barrier layers overlap said gate layer.

* * * * *